(12) United States Patent
Frederick, Jr.

(10) Patent No.: US 10,818,999 B2
(45) Date of Patent: Oct. 27, 2020

(54) COMPACT LOW LOSS SIGNAL COUPLER

(71) Applicant: pSemi Corporation, San Diego, CA (US)

(72) Inventor: Norman L. Frederick, Jr., Vista, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/781,835

(22) Filed: Feb. 4, 2020

(65) Prior Publication Data

US 2020/0251801 A1    Aug. 6, 2020

Related U.S. Application Data (63) Continuation of application No. 16/214,034, filed on Dec. 7, 2018, now Pat. No. 10,601,100, which is a continuation of application No. 15/594,336, filed on May 12, 2017, now Pat. No. 10,181,631.

(51) Int. Cl.

| | | |
|---|---|---|
| *H01P 5/18* | (2006.01) | |
| *H03H 7/38* | (2006.01) | |
| *H03H 7/48* | (2006.01) | |
| *H03H 7/01* | (2006.01) | |
| *H04B 1/52* | (2015.01) | |
| *H05K 1/02* | (2006.01) | |
| *H03C 7/02* | (2006.01) | |

(52) U.S. Cl.
CPC ............. *H01P 5/184* (2013.01); *H01P 5/185* (2013.01); *H01P 5/187* (2013.01); *H03C 7/02* (2013.01); *H03H 7/0115* (2013.01); *H03H 7/0123* (2013.01); *H03H 7/38* (2013.01); *H03H 7/48* (2013.01); *H03H 7/487* (2013.01); *H04B 1/52* (2013.01); *H05K 1/0237* (2013.01)

(58) Field of Classification Search
CPC .... H01P 5/12; H01P 5/18; H01P 5/184; H01P 5/185; H01P 5/187
USPC .................. 333/109–112, 116, 117
See application file for complete search history.

(56) References Cited

U.S. PATENT DOCUMENTS

| | | |
|---|---|---|
| 6,667,506 B1 | 12/2003 | Reedy et al. |
| 7,042,309 B2 | 5/2006 | Podell |
| 7,339,366 B2 | 3/2008 | Li |
| 8,502,620 B2 | 8/2013 | Lu et al. |
| 8,606,198 B1 | 12/2013 | Wright |

(Continued)

FOREIGN PATENT DOCUMENTS

TW       533623 B     5/2003

OTHER PUBLICATIONS

Takaoka, Dean O., Office Action received from the USPTO dated Jun. 29, 2018 for U.S. Appl. No. 15/594,336, 47 pgs.

(Continued)

*Primary Examiner* — Dean O Takaoka
(74) *Attorney, Agent, or Firm* — Jaquez Land Greenhaus LLP; John Land, Esq.

(57) ABSTRACT

A bi-directional coupler architecture that allows an entire radio frequency coupler to be fully integrated with other circuitry on a single IC substrate. Embodiments of the invention use a lumped component architecture instead of quarter-wave transmission lines to reduce area and limit loss on the primary signal line. In some embodiments, two directional couplers of opposite polarities are implemented at least in part using spiral secondary inductors electromagnetically coupled to a shared primary inductor signal line, thus providing a bi-directional coupler architecture.

21 Claims, 10 Drawing Sheets

(56) References Cited

U.S. PATENT DOCUMENTS

| | | |
|---|---|---|
| 8,798,561 B2 | 8/2014 | Acimovic |
| 8,981,870 B2 | 3/2015 | Colleoni et al. |
| 9,024,700 B2 | 5/2015 | Ranta |
| 9,197,194 B2 | 11/2015 | Reedy et al. |
| 9,397,635 B2 | 7/2016 | Costa |
| 9,438,196 B2 | 9/2016 | Smith et al. |
| 9,531,359 B1 | 12/2016 | Shrivastava |
| 9,553,617 B2 | 1/2017 | Srirattana et al. |
| 9,667,217 B2 | 5/2017 | Cheng et al. |
| 9,716,306 B2 | 7/2017 | Kuroda |
| 9,905,901 B1 | 2/2018 | Lyu et al. |
| 10,181,631 B2 | 1/2019 | Frederick |
| 10,181,823 B1 | 1/2019 | Cheng et al. |
| 10,601,100 B2 | 3/2020 | Frederick, Jr. |
| 2007/0103253 A1 | 5/2007 | Napijalo |
| 2009/0096531 A1 | 4/2009 | Shimamoto et al. |
| 2013/0324057 A1 | 12/2013 | Zhang et al. |
| 2014/0111156 A1 | 4/2014 | Lee et al. |
| 2015/0042412 A1 | 2/2015 | Imbornone et al. |
| 2016/0028146 A1 | 1/2016 | Zhang et al. |
| 2018/0331411 A1 | 11/2018 | Frederick |
| 2019/0020316 A1 | 1/2019 | Cheng et al. |
| 2019/0198964 A1 | 6/2019 | Norman |

OTHER PUBLICATIONS

Takaoka, Dean O., Notice of Allowance received from the USPTO dated Oct. 19, 2018 for U.S. Appl. No. 15/594,336, 12 pgs.

PSemi Corporation, Response filed in the USPTO on Aug. 2, 2018 for U.S. Appl. No. 15/594,336, 13 pgs.

Takaoka, Dean O., Office Action received from the USPTO dated Jul. 22, 2019 for U.S. Appl. No. 16/214,034, 15 pgs.

Takaoka, Dean O., Notice of Allowance received from the USPTO dated Nov. 14, 2019 for U.S. Appl. No. 16/214,034, 7 pgs.

PSemi Corporation, Preliminary Amendment filed in the USPTO dated Dec. 7, 2018 for U.S. Appl. No. 16/214,034, 6 pgs.

PSemi Corporation, Response filed in the USPTO on Oct. 21, 2019 for U.S. Appl. No. 16/214,034, 8 pgs.

Nguyen, Khanh V., Notice of Allowance received from the USPTO dated Nov. 28, 2018 for U.S. Appl. No. 15/652,079, 10 pgs.

Nguyen, Khanh V., Notice of Allowance received from the USPTO dated Sep. 21, 2018 for U.S. Appl. No. 15/652,079, 5 pgs.

Nguyen, Khanh V., Office Action received from the USPTO dated Mar. 22, 2018 for U.S. Appl. No. 15/652,079, 12 pgs.

COMPACT LOW LOSS SIGNAL COUPLER

CROSS-REFERENCE TO RELATED APPLICATIONS—CLAIM OF PRIORITY

This application is a continuation of, and claims the benefit of priority under 35 USC § 120 of, commonly assigned and prior U.S. application Ser. No. 16/214,034, filed Dec. 7, 2018, entitled "Compact Low Loss Signal Coupler", the disclosure of which is incorporated herein by reference in its entirety. Application Ser. No. 16/214,034 is a continuation of, and claims the benefit of priority under 35 USC § 120 of, commonly assigned prior U.S. application Ser. No. 15/594,336, filed May 12, 2017, "Compact Low Loss Signal Coupler", now U.S. Pat. No. 10,181,631, issued Jan. 15, 2019, the disclosure of which is incorporated herein by reference in its entirety.

BACKGROUND

(1) Technical Field

This invention relates to electronic circuits, and more particularly to coupler circuits.

(2) Background

A directional coupler is a passive electronic device often used in radio and telecommunications systems that allows a defined amount of the power in a radio frequency (RF) signal flowing from an input port to an output port of a transmission line to be electromagnetically coupled to a coupled port. An essential feature of directional couplers is that they only couple power flowing in one direction (i.e., they are uni-directional).

Figure 1A:
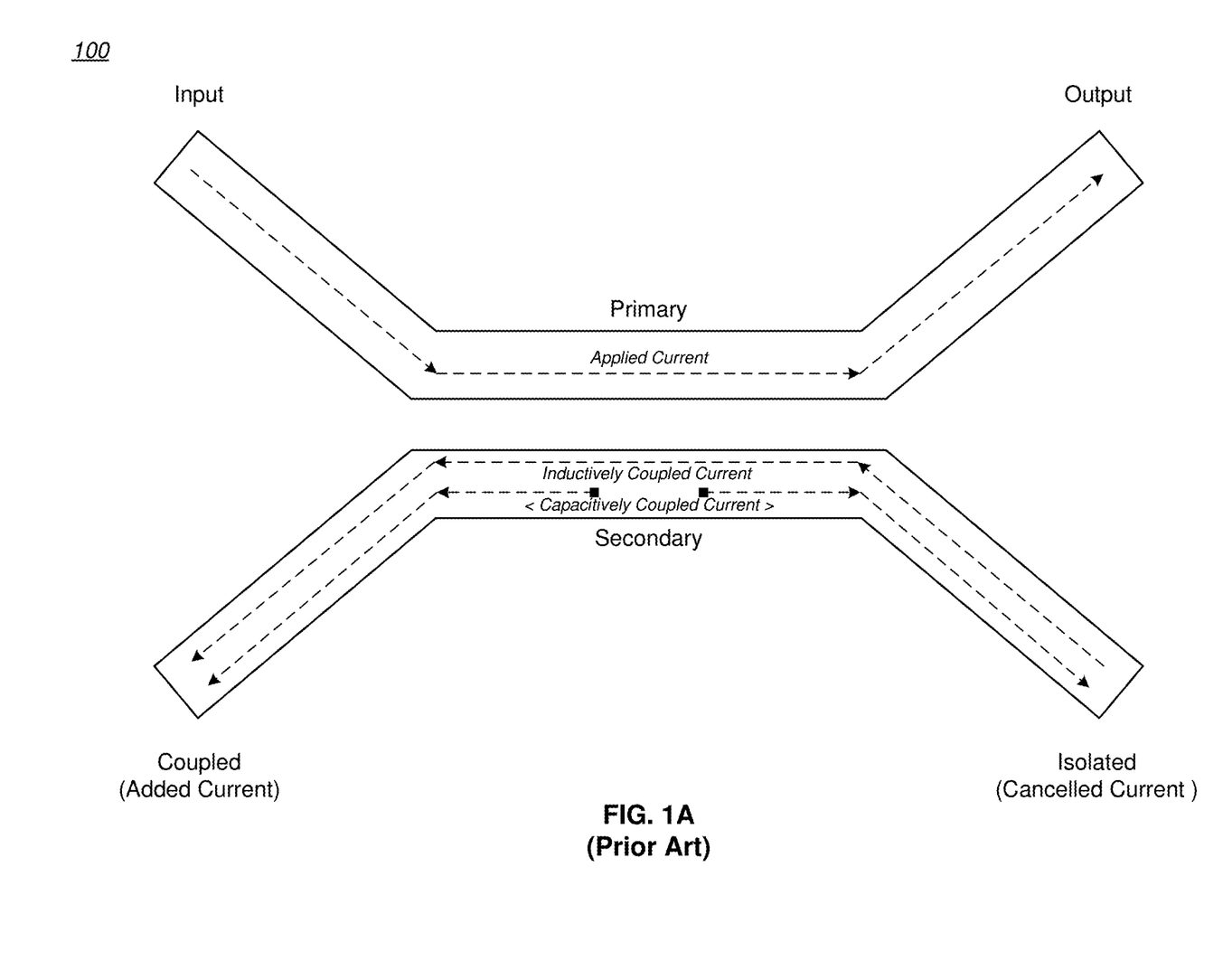
FIG. 1A is a schematic diagram of a prior art 3 dB quarter-wave directional coupler comprising a Primary transmission line and a Secondary transmission line.

A directional coupler may be implemented with two quarter-wave length transmission lines in close enough proximity so that energy from one transmission line passes to the other transmission line via inductive and capacitive coupling. For example, FIG. 1A is a schematic diagram of a prior art 3 dB quarter-wave directional coupler 100 comprising a Primary transmission line and a Secondary transmission line. As is known in the art, such quarter-wave length directional couplers have four ports:

(1) An Input port, where power is applied (e.g., an RF signal), as indicated by the Applied Current arrows.
(2) A Coupled port, where an electromagnetically coupled portion of the power applied to the Input port appears; in the case of a 3 dB coupler, one-half of the applied input power is available at the Coupled port. Current is both inductively and capacitively added at the Coupled port, as indicated by the respective current flow arrows.
(3) An Output (or direct) port where the power from the Input Port is output, less the portion of the power that went to the Coupled port. In the case of a 3 dB coupler, one-half of the applied input power is available at the Output port.
(4) An Isolated port, where inductively coupled current and capacitively coupled current essentially cancel each other, as indicated by the respective current flow arrows.

Figure 1B:
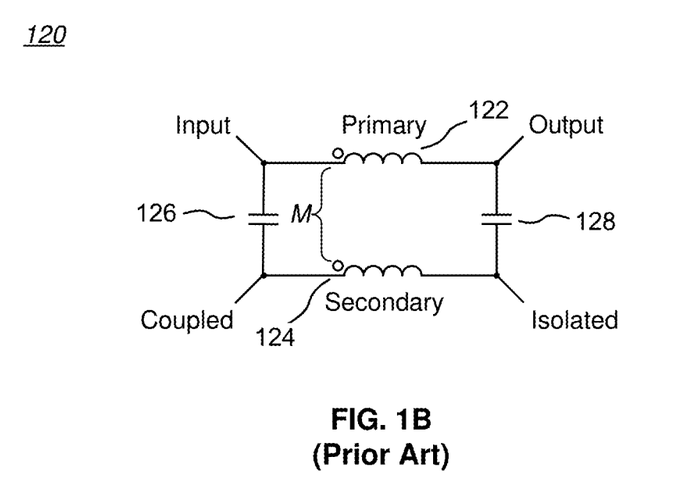
FIG. 1B is a schematic diagram of a simple equivalent circuit of the quarter-wave directional coupler of FIG. 1A.

FIG. 1B is a schematic diagram 120 of a simple equivalent circuit of the quarter-wave directional coupler of FIG. 1A. The inductive coupling of the quarter-wave lengths of the Primary and Secondary transmission lines may be respectively modeled as inductors 122, 124, while the capacitive coupling between the transmission lines may be modeled as capacitors 126, 128. There is also a mutual inductive coupling M between both inductors 122, 124. In more complete models, parasitic capacitances (e.g., between the transmission lines and a ground plane) may be coupled to each port (not shown).

Directional couplers have many applications, including providing a signal sample for measurement or monitoring (e.g., for power, Voltage Standing Wave Ratio, etc.), feedback, combining feeds to and from antennae, antenna beam forming, and separating transmitted and received signals. For example, directional couplers are a key element in cellular telephone modules, being used to support antenna tuning, dynamic impedance matching, and power control.

However, for many applications, including integrated circuits (ICs), conventional directional coupler designs have too much signal loss on the primary transmission line and require too much IC area. For example, directional couplers of the type shown in FIG. 1A necessarily require quarter-wave lengths of Primary and Secondary transmission lines in order to match a desired system characteristic impedance (e.g., 50 ohms), resulting in a long signal line from the Input port to the Output port. As one example, for transmission lines implemented on typical IC substrates and optimized for a 2 GHz frequency, the quarter-wave length is nearly 20 mm. Accordingly, in many systems, such directional couplers are often separate devices that are electrically connected to an active circuit IC, thus further contributing to signal loss and introducing parasitic circuit elements (e.g., parasitic capacitances and inductances) that reduce circuit performance even more. Moreover, the need for separate directional coupler devices increases costs (design, assembly, and supply chain are more complicated when attaching a separate component), and reduces yield (for example, an entire module would have to be thrown away if one of the components fails; fewer components reduces this risk).

Accordingly, there is a need for a coupler architecture that allows an entire coupler to be fully integrated with other circuitry on a single IC substrate. The present invention provides for such an architecture and provides additional benefits.

SUMMARY

The invention encompasses a bi-directional coupler architecture that allows an entire radio frequency coupler to be fully integrated with other circuitry on a single integrate circuit (IC) substrate, as well as additional benefits. Embodiments of the invention use a lumped component architecture instead of quarter-wave transmission lines to reduce area and limit loss on the primary signal line. In some embodiments, two directional couplers of opposite polarities are implemented at least in part using spiral secondary inductors electromagnetically coupled to a shared primary signal line, thus providing a bi-directional coupler architecture.

The invention allows a designer a high degree of freedom in laying out a compact bidirectional coupler in terms of IC length and width dimensions, IC area, isolation spacing of the secondary spiral inductors, impedance of the primary strip inductor, usage and placement of a ground plane for isolation, and tuning element composition, placement, values, and grounding. Further, the dual spiral inductor architecture makes design of ICs for particular applications much easier, since it is simply easier to design separate, isolated couplers, one for each signal direction.

Benefits of the invention include the following:
  compact layouts save IC space (especially compared to
    traditional quarter-wave directional couplers) and can
    be integrated with RF switches on the same IC substrate;

a short primary strip inductor (the signal through-line) does not significantly load the signal through-line and has minimal effect with respect to perturbing an RF input signal (significantly less than a quarter-wave directional coupler);

using two directional couplers benefits directivity and isolation;

the ports of each coupler may be separately tuned to optimize performance and support different impedances at each coupled port;

internal ports within each coupler provide additional tuning degrees of freedom;

different input and output impedances are supported;

the dual spiral inductor architecture makes design of ICs for particular applications much easier, since it is easier to design separate, isolated couplers, one for each signal direction; and narrow band and low coupling coefficient requirements allow for simple circuit topologies.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The invention encompasses a bi-directional coupler architecture that allows an entire radio frequency coupler to be fully integrated with other circuitry on a single IC substrate, as well as additional benefits. Embodiments of the invention use a lumped component architecture instead of quarter-wave transmission lines to reduce area and limit loss on the primary signal line. In some embodiments, two directional couplers of opposite polarities are implemented at least in part using spiral secondary inductors electromagnetically coupled to a shared primary signal line, thus providing a bi-directional coupler architecture.

Figure 2A:
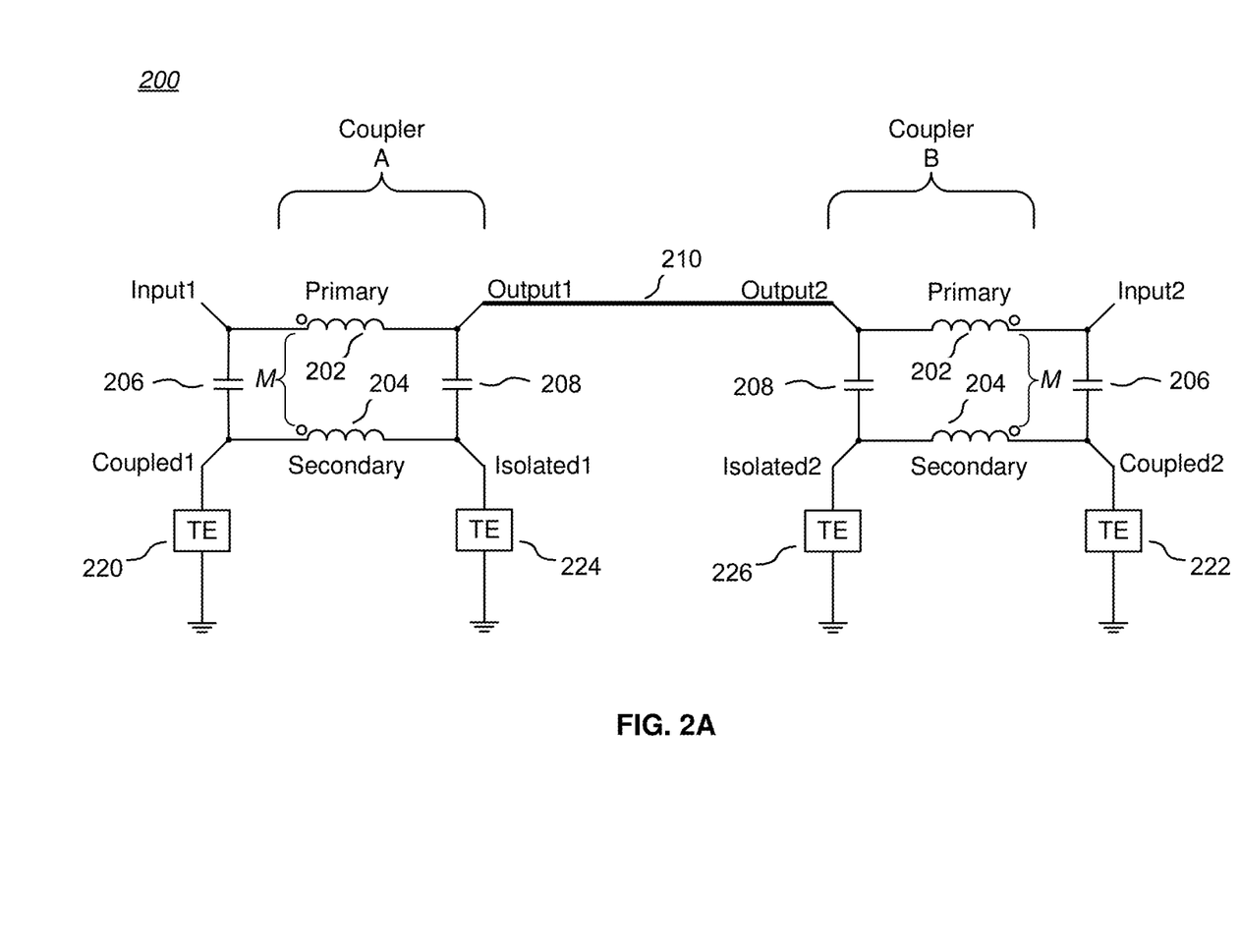
FIG. 2A is a schematic diagram of a simple equivalent circuit of a bi-directional coupler architecture in accordance with the present invention.

FIG. 2A is a schematic diagram of a simple equivalent circuit of a bi-directional coupler architecture 200 in accordance with the present invention. Two compact Couplers A, B are shown in schematic form, each coupler circuit A, B having Primary and Secondary sections modeled as inductors 202, 204 and capacitors 206, 208 and a mutual inductance of M. The two inductors 202, 204 of each Coupler A, B are fabricated in close enough proximity so that energy from one inductor 202 passes to the other inductor 204 via inductive and capacitive coupling. Parasitic capacitances (e.g., between the inductors 202, 204 and a ground plane, if provided) also may be coupled to each port (not shown).

Importantly, the Couplers A, B have opposite polarities, as indicated by the conventional circle symbol adjacent the coil symbol for each inductor 202, 204. In addition, the output ports (Output1, Output2) of both Couplers A, B are electrically connected, as indicated by the bold line 210.

The coupled ports (Coupled1, Coupled2) of each Coupler A, B may be connected to tuning elements (TE) 220, 222. The isolated ports (Isolated1, Isolated2) of each Coupler A, B also may be connected to TEs 224, 226, thus providing an additional degree of design freedom with respect to tuning. The TEs 220-226 may be, for example, simple capacitors, but may be more complex circuits that include passive RL, RC, LC, or RLC elements, with or without active circuit components (e.g., shunt or bypass switches). The TEs 220-226 are generally used to enhance both coupler performance and matching to connecting circuits. The TEs 220-226 may differ in architecture and component value for each port, and need not be discrete components in some applications. For example, in some embodiments, the TEs 220-226 may be implemented as parasitic capacitances, such as a ground plane that provides sufficient parasitic capacitance with respect to the structures that form the inductors 202, 204.

As should be clear, the labels for the ports in FIG. 2A are those conventionally assigned to uni-directional couplers. However, the coupler architecture 200 of FIG. 2A behaves as a bi-directional coupler, and the port labels do not necessarily reflect the named "function" in all modes of operation. More specifically, because the output ports (Output1, Output2) of both Couplers A, B are electrically connected (and generally not externally accessible), the bi-directional coupler architecture 200 of FIG. 2A will behave asymmetrically with respect to input signals applied to the input ports (Input1, Input2). That is, the Coupled2 port of Coupler B will act as an isolated port for a signal applied to the Input1 port of Coupler A. Conversely, the Coupled1 port of Coupler A will act as an isolated port for a signal applied to the Input2 port of Coupler B. For example, if a transmit signal from an RF transmitter is applied to Input1 for output at Input2 (e.g., to an antenna), a fraction of the applied signal power may be tapped/monitored at the Coupled1 port (e.g., by a transmitter-side power detector), and essentially no power will appear at the Coupled2 port. In contrast, if a received signal (e.g., from an antenna) is applied to Input2 for output at Input1, a fraction of the applied signal power may be tapped/monitored at the Coupled2 port (e.g., by a receiver-side power detector), and essentially no power will appear at the Coupled1 port. Accordingly, the coupled ports (Coupled1, Coupled2) are isolated from each other.

In order to fully integrate the entire bi-directional coupler architecture 200 with other circuitry on a single IC substrate, conventional quarter-wave length directional couplers are of little use due to size and signal loss. Embodiments of the present invention therefore use a lumped element solution to reduce area and limit loss on the primary signal line.

Figure 2B:
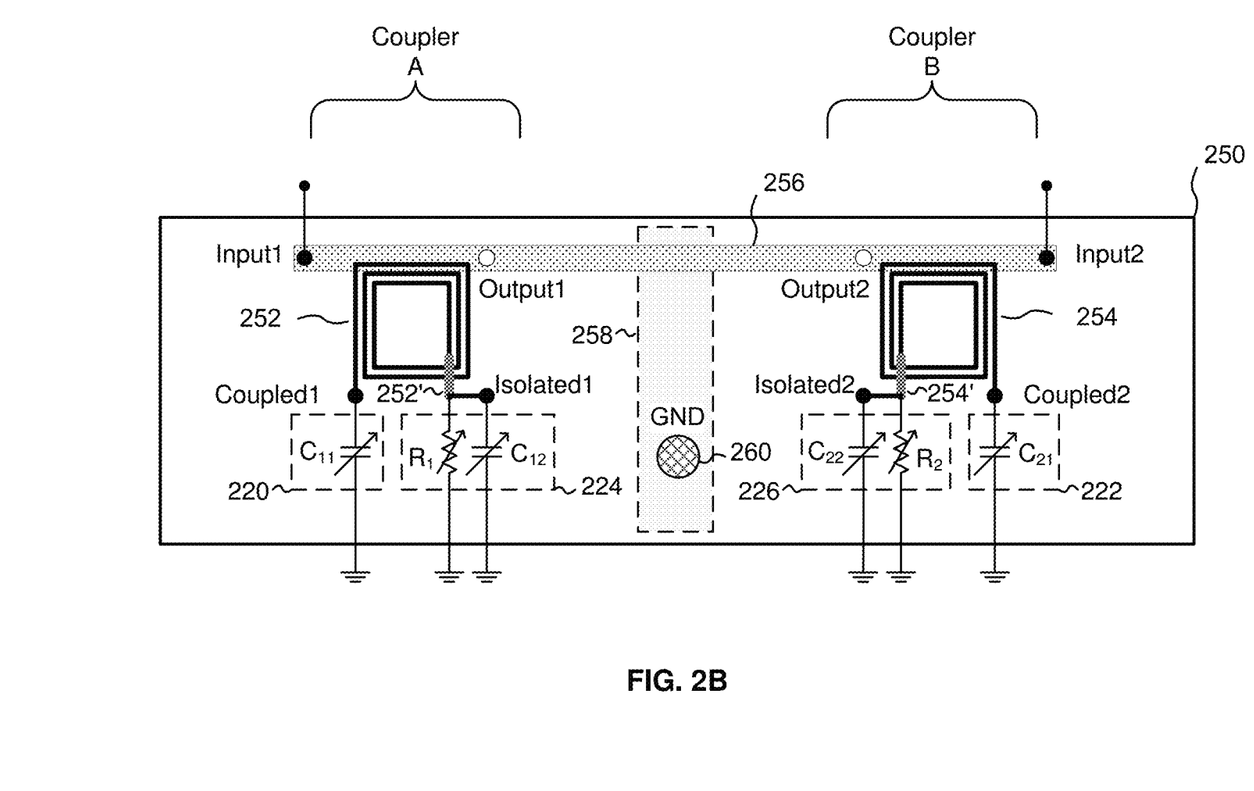
FIG. 2B is a top plan view of an integrated circuit layout of a bi-directional coupler architecture in accordance with the present invention, with some circuit elements shown schematically.

FIG. 2B is a top plan view of an integrated circuit layout of a bi-directional coupler architecture in accordance with the present invention, with some circuit elements shown schematically. On an IC substrate 250, such as a silicon-on-insulator (SOI)—which includes siliconon-sapphire (SOS)—two spiral inductors 252, 254 are formed in conventional fashion. As is known in the art, while the main body of each spiral inductor 252, 254 commonly would be fabricated in substantially the same plane, a cross-over segment 252', 254' may be fabricated in another plane (e.g., a metal layer overpass above or underpass below the plane of the main spiral body) and electrically connected (e.g., by vertical vias) so as to provide an accessible circuit connection to the inner end of the corresponding spiral inductor 252, 254. While a generally square-shaped spiral structure is shown for the spiral inductors 252, 254, the general shape of the spiral inductors 252, 254 may be, for example, circular, octagonal, hexagonal, or other suitable geometric form, and may be irregular. Accordingly, there is a good deal of design flexibility in laying out the spiral inductors 252, 254.

As indicated by their winding direction, the two spiral inductors 252, 254 are of opposite polarities, meaning that these inductors are wound in opposite directions with respect to their individual coupled port. In operation, the spiral inductors 252, 254 would function as the Secondary sections shown schematically in FIG. 2A. Referring to FIG. 2B, in order to provide the function of the Primary sections schematically shown in FIG. 2A, as well as to provide the bidirectional coupling functionality of the equivalent circuit shown in FIG. 2A, a primary strip inductor 256 (also known as a "through line") is fabricated in close enough proximity to the two spiral inductors 252, 254 so that energy passes between the primary strip inductor 256 and the two spiral inductors 252, 254 via inductive and capacitive coupling. For example, the primary strip inductor 256 may be fabricated in a plane over or under the plane of the spiral inductors 252, 254, or in the same plane but spaced apart from the spiral inductors 252, 254 (e.g., adjacent an edge), so long as there is sufficient electromagnetic coupling to meet desired performance specifications. The degree of coupling between the primary strip inductor 256 and the spiral inductors 252, 254 may be controlled by their relative spacing, by the number of turns, the width of the turns, and the spacing of turns of the spiral inductors 252, 254, and by the width of the primary strip inductor 256. The material of primary strip inductor 256 and the spiral inductors 252, 254 can also affect magnetic coupling, and different dielectric materials of the IC can affect capacitive coupling. Thus, the single primary strip inductor 256 functions as a "merged" Primary inductor section for both of the Secondary section spiral inductors 252, 254, as well as a connector between the internal output ports (Output1, Output2) that serves the function of the connector line 210 schematically shown in FIG. 2A.

In accordance with the simple equivalent circuit of FIG. 2A, each coupled port (Coupled1, Coupled2) is effectively an independent network of one spiral inductor 252, 254 and two capacitors (due to capacitive coupling). By keeping the spiral inductors 252, 254 spaced far enough apart, a high degree of isolation and improved directivity may be achieved. For example, about 200 μm of spacing is generally sufficient to achieve 30 dB of isolation and about 20 dB of directivity, although these values are also dependent on the specific layout geometry and tuning elements. There is generally some trade-off in spacing versus insertion loss of the primary strip inductor 256: spacing the spiral inductors 252, 254 farther away from each other improves performance because there is less interaction between them, but lengthens the primary strip inductor 256, increasing its impedance and hence its insertion loss.

Isolation may also be improved by adding a ground plane 258 between the spiral inductors 252, 254. As noted above, if a ground plane 258 is provided, then the TEs 220-226 may not be necessary in some applications if the ground plane provides sufficient parasitic capacitance with respect to the structures that form the primary and secondary inductors 252, 254, 256.

The spiral inductors 252, 254 provide a controlled amount of coupling with respect to the primary strip inductor 256. Even with an essentially short, straight primary strip inductor 256, the greater effective length of the spiral inductors 252, 254 allows sufficient inductive and capacitive coupling to couple a useful sample of energy to the Coupled1 port (for RF signal input applied to the Input1 port) and the Coupled2 port (for RF signal input applied to the Input2 port). For many applications, it is desirable to couple only a small portion of the RF signal input in order to monitor the signal but limit disturbance of or loss to the signal. The sampled energy may be used for such applications as measurement or monitoring (e.g., for power, Voltage Standing Wave Ratio, etc.), feedback, combining feeds to and from antennae, antenna beam forming, separating transmitted and received signals, antenna tuning, dynamic impedance matching, and power control, to name just a few.

In the embodiment shown in FIG. 2B, the tuning elements (TEs) 220-226 of FIG. 2A are shown with specific implementations. Thus, for example, tuning capacitors $C_{11}$, $C_{21}$ may be respectively connected between the Coupled1 and Coupled2 ports and a common potential (e.g., circuit ground). As another example, RC tuning networks each comprising a resistor $R_1$, $R_2$ and a corresponding capacitor $C_{12}$, $C_{22}$ may be respectively connected between the Isolated1 and Isolated2 ports and a common potential (e.g., circuit ground). As noted above, the values of the TEs 220-226 need not be identical. Thus, the coupled and isolated ports of Coupler A and Couple B may be tuned independently.

In some embodiments, the TEs 220-226 may be off-substrate (i.e., off-chip) components connected through dedicated contacts or terminals. In other embodiments, the TEs 220-226 (as well as other circuitry, such as one or more RF switches) may be fabricated on the substrate 250 to provide a fully integrated bi-directional coupler architecture. For the latter cases, it may be useful to provide a common on-substrate ground connection 260, such as a single solder bump, to which all of the ground connections shown in FIG. 2B may be made. Use of a single contact for the ground connection 260 reduces the adverse effects of having multiple contacts and terminals, which can cause added parasitic inductances, parasitic capacitances, and electromagnetic coupling between the contacts/terminals themselves.

As indicated, the resistors and capacitors shown in FIG. 2B are depicted as variable value elements (of course, fixed value elements may be used in some applications). In addition, the spiral inductors 252, 254 may also have selectable or variable values; for example, either or both of the spiral inductors 252, 254 may be made tunable by selecting an effective length or number of turns, such as by using integrated switches (e.g., FETs). Variable value elements may be used to provide such added benefits as wider bandwidth, band tuning, dynamic impedance tuning (e.g., based on the coupled signal), etc. Variable value elements may include multi-port spiral inductors, switched capacitor banks, digitally tunable capacitors (DTCs), digitally tunable inductors (DTLs), digital step attenuators (DSAs), variable resistors of various technologies, etc.

Examples of multi-port spiral inductors are disclosed in U.S. patent application Ser. No. 14/690,212, filed on Apr. 17, 2015, entitled "High Performance Integrated Tunable Impedance Matching Network with Coupled Merged Inductors", and in U.S. Pat. No. 9,438,196, issued on Sep. 6, 2016, entitled "Integrated Tunable Filter Architecture". Examples of DTCs are disclosed in U.S. Pat. No. 6,667,506, issued on Dec. 23, 2003, entitled "Variable Capacitor with Programmability", and in U.S. Pat. No. 9,024,700, issued on May 5, 2015, entitled "Method and Apparatus for use in Digitally Tuning a Capacitor in an Integrated Circuit Device". Examples of DTLs are disclosed in U.S. Pat. No. 9,197,194, issued on Nov. 24, 2015, entitled "Method and Apparatus for Use in Tuning Reactance in an Integrated Circuit Device". Examples of DSAs are disclosed in U.S. Pat. No. 9,397,635, issued on Jul. 19, 2016, entitled "Segmented Attenuator with Glitch Reduction", and in U.S. Pat. No. 9,531,359, issued on Dec. 27, 2016, entitled "Improved Multi-State Attenuator". All of these listed patents and patent applications are assigned to the assignee of the present invention, and their contents are hereby incorporated by reference.

Static, dynamic, or selectable tuning of the spiral inductors 252, 254 and/or other tunable elements in embodiments of the bi-directional coupler architecture of the present disclosure may be accomplished in a number of ways. For example, tuning may be by direct control, such as by control lines coupled to other circuitry (not shown), which may be internal or external. Thus, as one example, control signals may be provided to the control lines through the wellknown interfaces specified by the MIPI (Mobile Industry Processor Interface) Alliance, or through the well-known Serial Peripheral Interface (SPI) bus, or by direct control signal pins or lines, or by any other convenient means. As another example, dynamic tuning may be by a feedback control circuit coupled to the coupled signal, where the feedback control circuit monitors one or more characteristics of the coupled signal and changes tuning accordingly, such as when the RF input signal or load changes. In any case, applied control signals may be directly coupled to associated tunable elements (or switches controlling such elements), or be processed through combinatorial logic circuitry or a mapping circuit (e.g., a lookup table) before being coupled to the associated tunable elements. More generally, coupled energy available from at least one coupled port (Coupled1, Coupled2) may be applied to a feedback control circuit to adjust or regulate elements within the bi-directional coupler and/or other circuitry. For example, coupled signals could be applied to a feedback control circuit to re-adjust the main signal power or phase of an RF transmitter or the like in real time, or to retune the coupled path to handle frequency variation of the main through-signal.

Alternative Configurations

While FIG. 2B depicts a quite useful layout of the primary strip inductor 256 and spiral inductors 252, 254, other layouts are within the ambit of the present invention. For example, FIGS. 2C-2G show a variety of alternative layouts (in all examples, other circuitry and labels shown in FIG. 2B have been omitted for clarity).

Figure 2C:
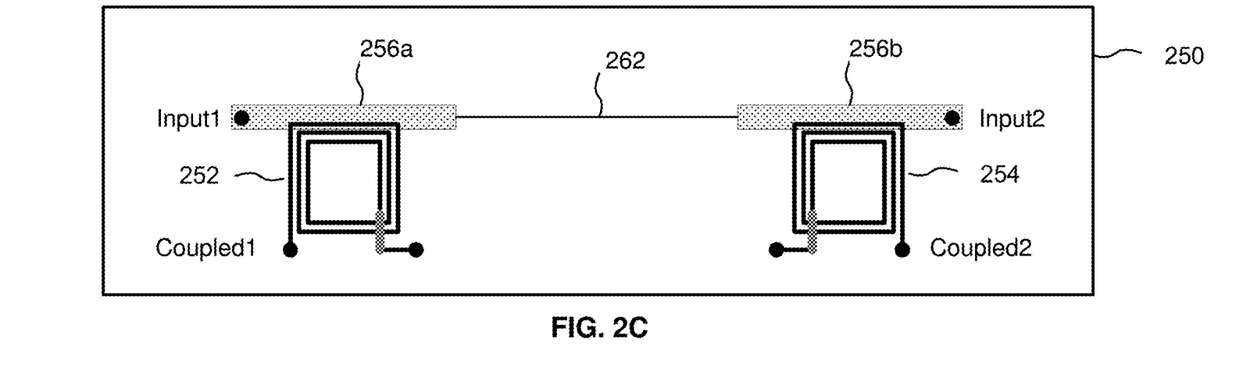
FIG. 2C is a top plan view of an integrated circuit layout of a bi-directional coupler architecture having widely spaced spiral inductors connected by a modified, two-part primary strip inductor.

FIG. 2C is a top plan view of an integrated circuit layout of a bi-directional coupler architecture having widely spaced spiral inductors 252, 254 connected by a modified, two-part primary strip inductor 256a, 256b. In this example, the two parts 256a, 256b of the primary strip inductor are connected by a conductor 262, which may be in the same plane or a different plane as the IC substrate 250. As described above, widely spacing the spiral inductors 252, 254 improves isolation. By splitting the primary strip inductor into two parts 256a, 256b, the electromagnetic coupling of each part may be optimized with respect to its associated spiral inductor 252, 254; for example, isolation and directivity may be improved by separating the primary strip inductor into two parts 256a, 256b.

Figure 2D:
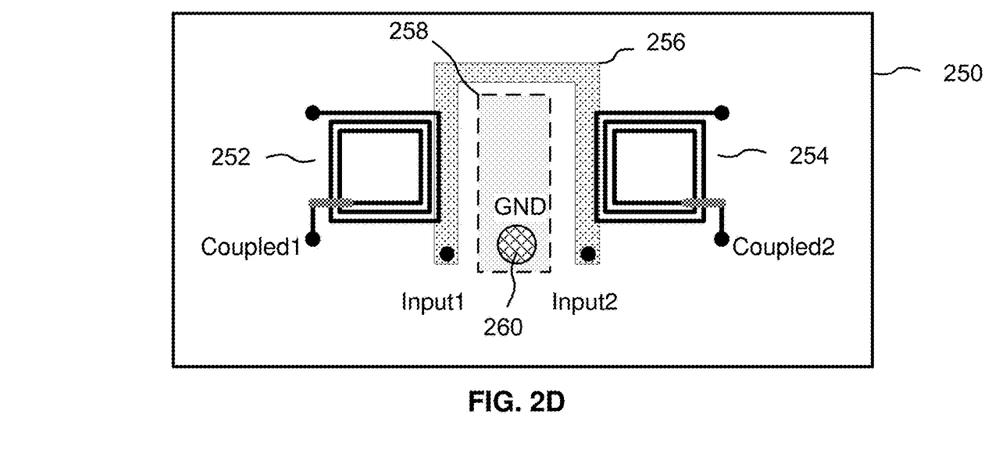
FIG. 2D is a top plan view of an integrated circuit layout of a bi-directional coupler architecture having spiral inductors connected by a U-shaped primary strip inductor positioned between the spiral inductors.

FIG. 2D is a top plan view of an integrated circuit layout of a bi-directional coupler architecture having spiral inductors 252, 254 connected by a U-shaped primary strip inductor 256 positioned between the spiral inductors 252, 254. An optional ground plane 258 and on-substrate ground connection 260 (also shown in FIG. 2B) are also illustrated.

Figure 2E:
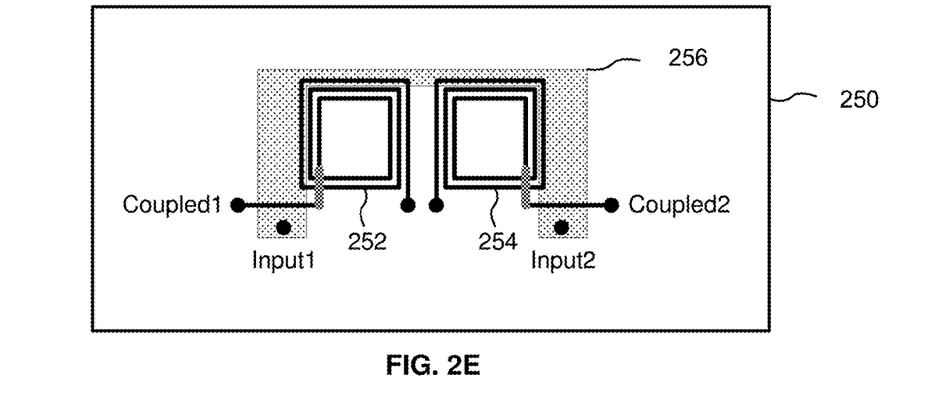
FIG. 2E is a top plan view of an integrated circuit layout of a bi-directional coupler architecture having spiral inductors connected by a U-shaped primary strip inductor positioned around the outside of the spiral inductors.

FIG. 2E is a top plan view of an integrated circuit layout of a bi-directional coupler architecture having spiral inductors 252, 254 connected by a U-shaped primary strip inductor 256 positioned around the outside of the spiral inductors 252, 254. FIG. 2E also illustrates that the primary strip inductor 256 need not have a uniform width along its length.

Figure 2F:
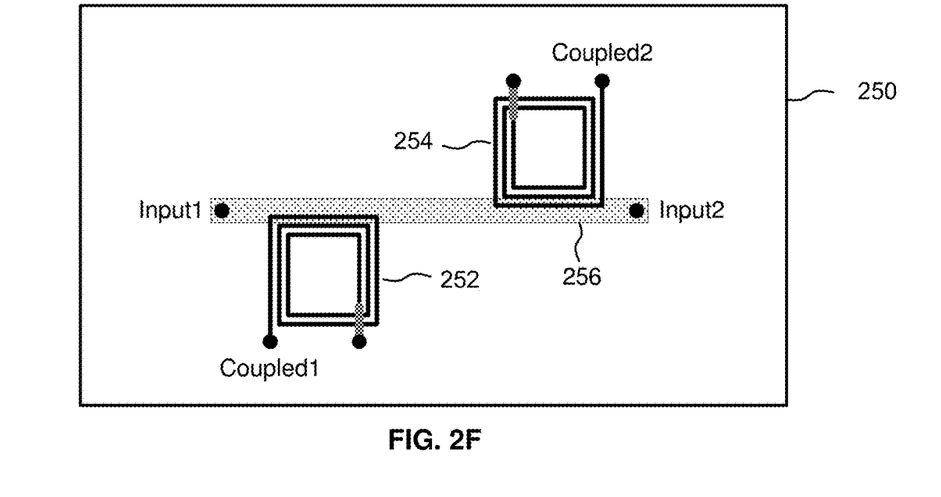
FIG. 2F is a top plan view of an integrated circuit layout of a bi-directional coupler architecture having spiral inductors connected by—and on opposite sides of—a primary strip inductor.

FIG. 2F is a top plan view of an integrated circuit layout of a bi-directional coupler architecture having spiral inductors 252, 254 connected by—and on opposite sides of—a primary strip inductor 256 (note that while the physical winding direction of the two illustrated spiral inductors 252, 254 is the same—clockwise from the coupled ports—because they are on opposite sides of the primary strip inductor 256, the two spiral inductors 252, 254 are still of opposite polarities).

Figure 2G:
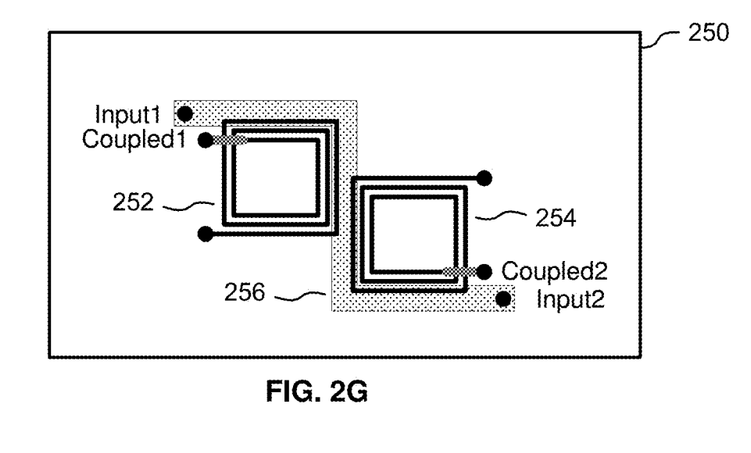
FIG. 2G is a top plan view of an integrated circuit layout of a bi-directional coupler architecture having spiral inductors connected by—and on opposite sides of—a meandering "Z" shaped primary strip inductor.

FIG. 2G is a top plan view of an integrated circuit layout of a bi-directional coupler architecture having spiral inductors 252, 254 connected by—and on opposite sides of—a meandering "Z" shaped primary strip inductor 256 (again note that, while the physical winding direction of the two illustrated spiral inductors 252, 254 is the same—clockwise from the coupled ports—because they are on opposite sides of the primary strip inductor 256, the two spiral inductors 252, 254 are still of opposite polarities).

In FIGS. 2C and 2E-2G, an optional ground plane 258 and on-substrate ground connection 260 (as shown in FIGS. 2B and 2D) also may be provided.

Benefits & Example ICs

As should be clear from the above description, the invention encompasses a bi-directional coupler architecture that allows an entire coupler to be fully integrated with other circuitry (e.g., an RF switch) on a single IC substrate using a lumped component architecture to reduce area and limit loss on the primary signal line. In many embodiments, no additional external devices (e.g., surface mount devices) are required for a complete solution. As FIG. 2B illustrates, a complete impedance matched (only required for the coupled ports) and properly tuned bi-directional coupler can be implemented on an IC substrate 250 using just two spiral inductors 245, 254, a shared primary strip inductor 256, four capacitors, and two resistors. Using two directional couplers configured as a bi-directional coupler benefits directivity and isolation.

As should be appreciated by the example shown in FIG. 2B, the primary strip inductor 256 is significantly shorter than the effective combined lengths of the spiral inductors 252, 254. Further, the length of the primary strip inductor 256 is not dependent on wavelength, as is the case with a conventional quarter-wave directional coupler. Accordingly, the impedance presented by the short primary strip inductor 256 is low, as is the associated signal insertion loss—that is, the short primary strip inductor 256 (the signal through-line) behaves as if it is "impedance neutral", meaning that is does not significantly load the signal through-line and has minimal effect with respect to perturbing an RF input signal. For example, in some embodiments, the length of the primary strip inductor 256 can be less than about 5% of the length of a quarterwave directional coupler for the same frequency range, thus enabling more compact IC's. In one specific example, an IC manufactured in accordance with FIG. 2B had a total length for the primary strip inductor 256 of about 0.79 mm, compared to a quarter-wave directional coupler length of nearly 20 mm at a 2 GHz frequency. The same example IC had an insertion loss of only about 0.08 dB, compared with an insertion loss of about 0.15 dB for a conventional quarter-wave directional coupler. As a further consequence of the impedance neutral characteristic of the signal through-line (the primary strip inductor 256), embodiments of the invention generally have an inherently broader bandwidth than a quarter-wave directional coupler. More specifically, because the through-line is impedance neutral, it does not require additional matching components and is thus broadband (on the other hand, the coupled ports may be more narrow band if specifically tuned with capacitors and resistors to optimized frequency specific performance).

The relatively short length of the primary strip inductor 256 is offset by the greater effective length of the coupled spiral inductors 252, 254, which can have multiple turns to increase mutual inductive coupling. Further, only a small amount of coupled energy is needed for monitoring or sensing circuits, and therefore such coupling will not load the RF input signal.

The low loss, impedance neutral characteristic of the signal through-line means few—or even no—matching components need to be added to impedance match the input (e.g., a transmitter circuit) to the output (e.g., an antenna). In contrast, conventional quarter-wave directional couplers as well as other conventional couplers must be perfectly impedance matched and tuned by providing impedance matching networks on all ports—otherwise isolation and directivity can degrade significantly with capacitor value shifts (e.g., due to PVT changes).

Further, the signal through-line is impedance neutral independent of the impedance tuning at any of its ports. Thus, each coupled port (Coupled1, Coupled2) of each Coupler A, B can be tuned to match a specific impedance, independent of all other ports. Moreover, the internal isolated ports (Isolated1, Isolated2) of each Coupler A, B provide additional parameters to tune (e.g., $R_1$, $C_{12}$, $C_{22}$, $R_2$ in FIG. 2B). In contrast, traditional couplers must have the same impedance at all ports.

In some applications, supplying capacitors to ground on the coupled ports (Coupled1, Coupled2), such as $C_{11}$ and $C_{21}$ in FIG. 2B, provides impedance transformation on the coupled ports (i.e., from each input port to the corresponding coupled port). Such impedance transformation is useful for applications such as connection of a coupled port to a power detector, which generally needs a specific impedance.

The area of an IC manufactured in accordance with FIGS. 2B-2D will also be reduced, since typical conventional directional couplers require meandering parallel lines, folded back to accomplish long routing of both the through and coupled lines. In general, chip height will also be reduced since external devices will not be needed (e.g., soldered-on surface mounted devices). For example, the area of the example IC mentioned above, using a lumped element (primary strip inductor plus spiral secondary inductors) architecture, was about 790 μm×300 μm. In comparison, a conventional quarter-wave directional coupler IC made with a similar fabrication technology had an area of about 840 μm×640 μm and required external capacitors (using surface mount devices, or SMDs). As should be appreciated, the example IC is about 44% smaller than the conventional solution, resulting in higher yields per substrate and lower costs per IC. Further, the area savings generally would be non-linear with increases in frequency—that is, at higher frequencies, embodiments of the present invention generally will be even smaller in proportionate area compared to conventional coupled designs.

As should be appreciated, the invention allows a designer a high degree of freedom in laying out a bi-directional coupler in terms of IC length and width dimensions, IC area, isolation spacing of the secondary spiral inductors 252, 254, impedance of the primary strip inductor 256, usage and placement of a ground plane for isolation, and tuning element connections (including connection to the isolated ports of each Coupler A, B to meet performance specifications for the external input and coupled ports), composition, placement, values, and grounding. Further, the dual spiral inductor architecture makes design of ICs for particular applications much easier, since it is simply easier to design separate, isolated couplers, one for each signal direction.

Methods

Figure 3:
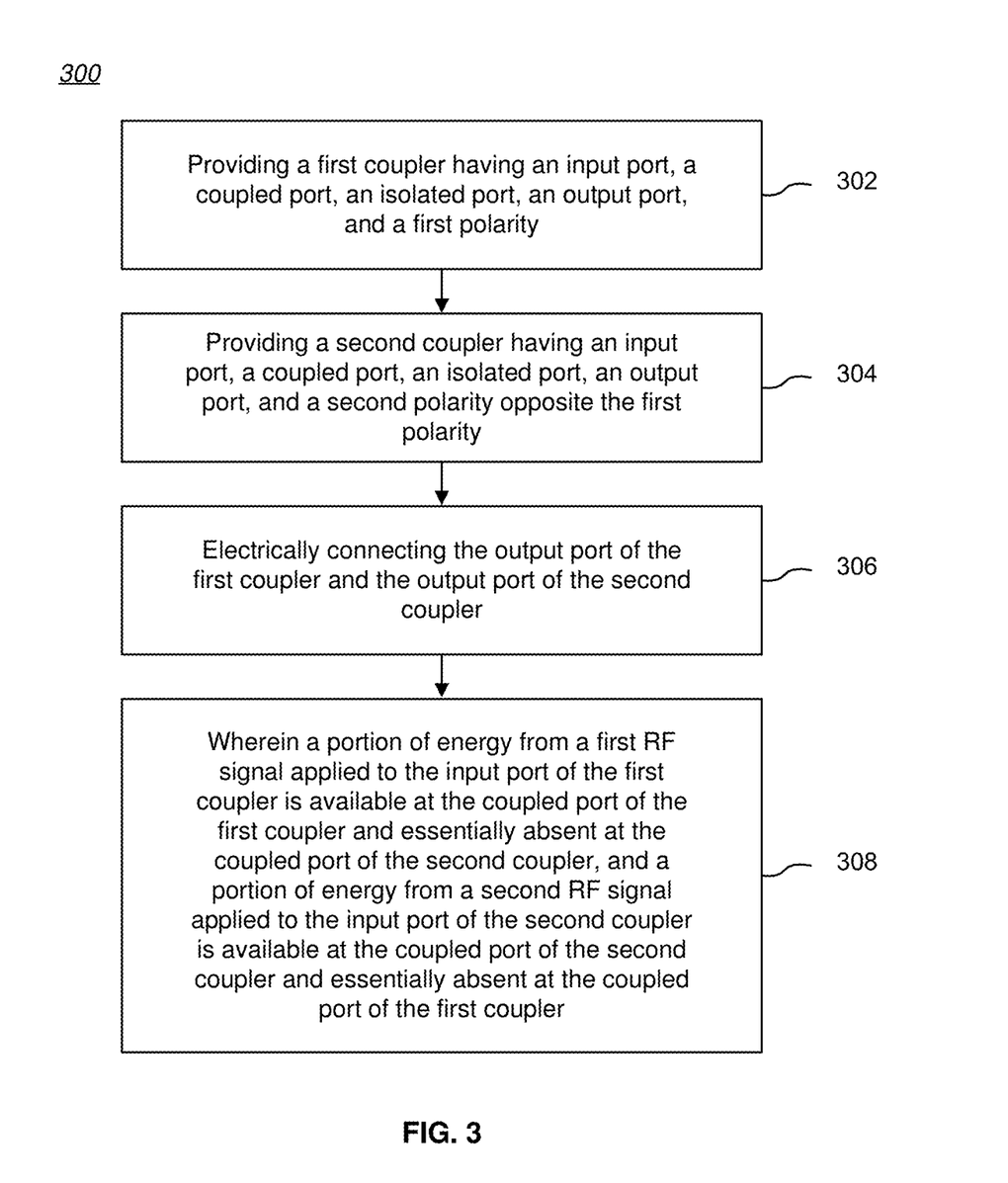
FIG. 3 is a process flow diagram showing a first method for bi-directionally coupling radio frequency (RF) signals.

Another aspect of the invention includes methods for bi-directionally coupling radio frequency (RF) signals. For example, FIG. 3 is a process flow diagram 300 showing a first method for bi-directionally coupling radio frequency (RF) signals, including: providing a first coupler having an input port, a coupled port, an isolated port, an output port, and a first polarity (STEP 302); providing a second coupler having an input port, a coupled port, an isolated port, an output port, and a second polarity opposite the first polarity (STEP 304); and electrically connecting the output port of the first coupler and the output port of the second coupler (STEP 306); wherein a portion of energy from a first RF signal applied to the input port of the first coupler is available at the coupled port of the first coupler and essentially absent at the coupled port of the second coupler, and a portion of energy from a second RF signal applied to the input port of the second coupler is available at the coupled port of the second coupler and essentially absent at the coupled port of the first coupler (STEP 308).

Figure 4:
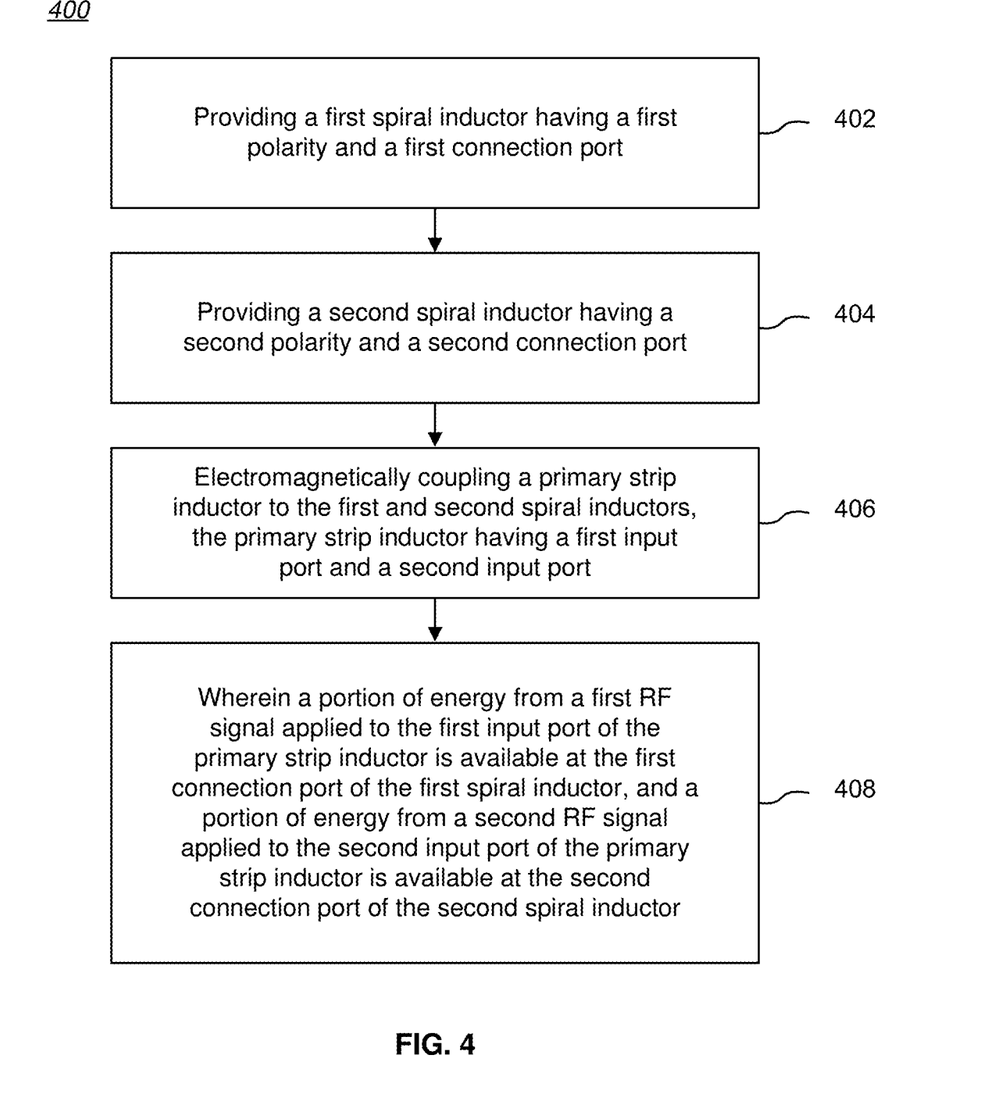
FIG. 4 is a process flow diagram showing a second method for bi-directionally coupling radio frequency (RF) signals.

As another example, FIG. 4 is a process flow diagram 400 showing a second method for bi-directionally coupling radio frequency (RF) signals, including: providing a first spiral inductor having a first polarity and a first connection port (STEP 402); providing a second spiral inductor having a second polarity and a second connection port (STEP 404); and electromagnetically coupling a primary strip inductor to the first and second spiral inductors, the primary strip inductor having a first input port and a second input port (STEP 406); wherein a portion of energy from a first RF signal applied to the first input port of the primary strip inductor is available at the first connection port of the first spiral inductor, and a portion of energy from a second RF signal applied to the second input port of the primary strip inductor is available at the second connection port of the second spiral inductor (STEP 408).

Figure 5:
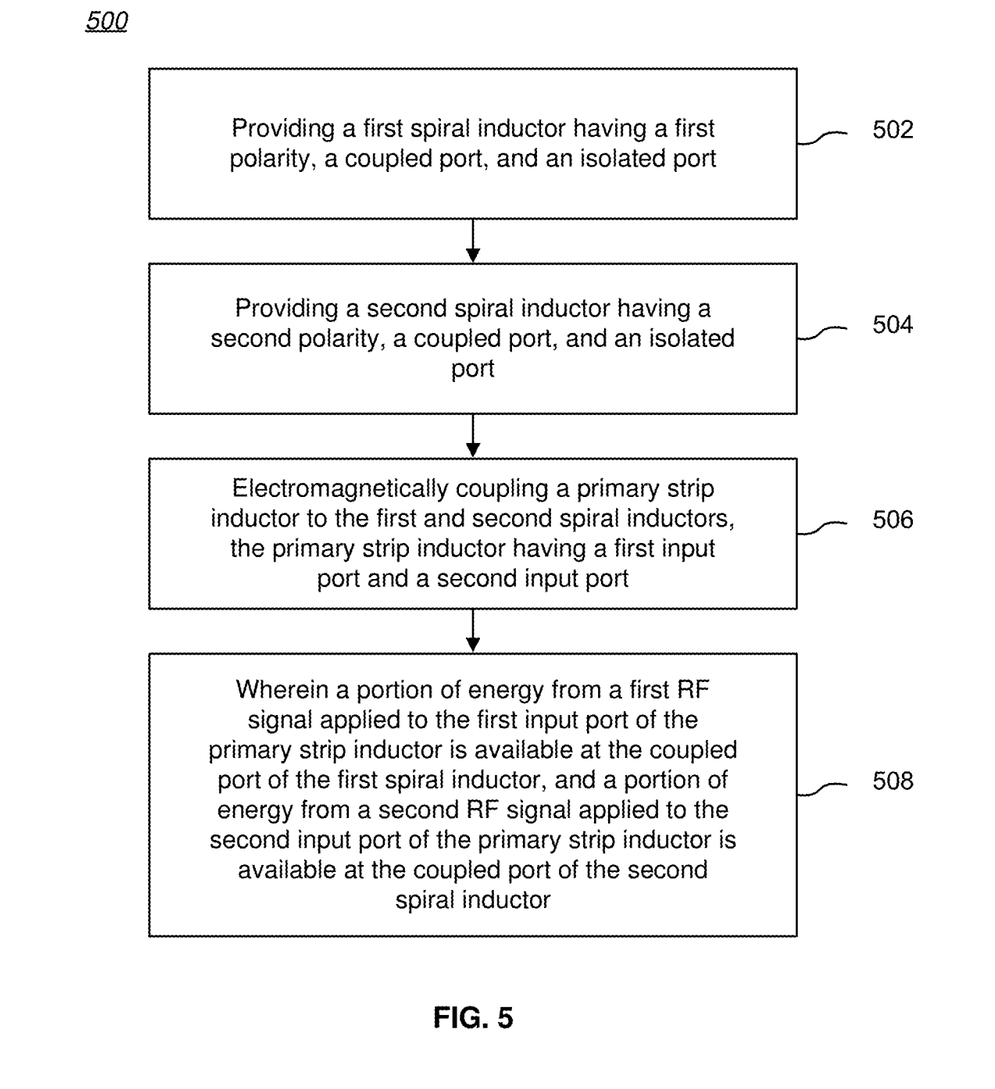
FIG. 5 is a process flow diagram showing a third method for bi-directionally coupling radio frequency (RF) signals.

As another example, FIG. 5 is a process flow diagram 500 showing a third method for bi-directionally coupling radio frequency (RF) signals, including: providing a first spiral inductor having a first polarity, a coupled port, and an isolated port (STEP 402); providing a second spiral inductor having a second polarity, a coupled port, and an isolated port (STEP 404); and electromagnetically coupling a primary strip inductor to the first and second spiral inductors, the primary strip inductor having a first input port and a second input port (STEP 406); wherein a portion of energy from a first RF signal applied to the first input port of the primary strip inductor is available at the coupled port of the first spiral inductor, and a portion of energy from a second RF signal applied to the second input port of the primary strip inductor is available at the coupled port of the second spiral inductor (STEP 408).

Other aspects of the above methods include one or more of the following: situating a ground plane between the first and second couplers or spiral inductors; fabricating the first and second couplers as part of an integrated circuit; connecting at least one tuning element between a common potential and at least one of a corresponding first connection port and/or second connection port; connecting at least one tuning element between a common potential and at least one of a corresponding coupled port and/or isolated port; having at least one tuning element be variable; having at least one tuning element include at least one of a C, RL, RC, LC, or RLC circuit, and/or a switch; spacing apart the first and second spiral inductors so as to be substantially isolated from each other; having at least one of the first and second spiral inductors be a multi-port spiral inductor; having the length of the primary strip inductor be not dependent on a wavelength of the applied first or second RF signals.

Fabrication Technologies & Options

As should be readily apparent to one of ordinary skill in the art, various embodiments of the invention can be implemented to meet a wide variety of specifications. Additional circuit components may be added to enhance the capabilities of the disclosed circuits and/or to provide additional functional without significantly altering the functionality of the disclosed circuits. Unless otherwise noted above, selection of suitable component values is a matter of design choice and various embodiments of the invention may be implemented in any suitable IC technology, or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in many technologies, such as MOSFET (including CMOS), bipolar, GaAs, GaAs HBT, GaAs pHEMT, GaN HEMT, and MESFET technologies. However, the inventive concepts described above are particularly useful with an SOI-based fabrication process (including SOS), and with fabrication processes having similar characteristics. Monolithic IC implementation is particularly useful since parasitic capacitances generally can be kept low (or at a minimum, kept uniform across all units, permitting them to be compensated) by careful design.

Note that "ground", "circuit ground", or "RF ground" in the context of the invention refers to a ground connection suitable for RF circuitry, rather than to "digital" ground. Conventionally, a digital ground is used for a DC and/or low frequency digital circuit and/or as an electro-static discharge (ESD) return path; such circuits in general do not carry a significant amount of root-mean square (RMS) current.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) coupler, including:
    (a) a first coupler of a first polarity having at least an input port, a coupled port, an isolated port, an output port, at least one of the coupled port and/or the isolated port of the first coupler being tunable;
    (b) a second coupler of a second polarity having at least an input port, a coupled port, an isolated port, an output port coupled to the output port of the first coupler, at least one of the coupled port and/or the isolated port of the second coupler being tunable;
    wherein the RF coupler is configured and tuned to provide bi-directional coupling such that the input port of the first coupler is essentially isolated from the coupled port of the second coupler, and the input port of the second coupler is essentially isolated from the coupled port of the first coupler.

2. A radio frequency (RF) coupler, including:
    (a) a first spiral inductor having a first polarity and a first connection port;
    (b) a second spiral inductor having a second polarity opposite the first polarity, and a second connection port;
    (c) a primary strip inductor electromagnetically coupled to the first and second spiral inductors and having a first input port and a second input port; and
    (d) at least one tuning element connected to at least one of the first connection port of the first spiral inductor or the second connection port of the second spiral inductor;
    wherein the RF coupler is configured to provide bi-directional coupling for RF signals applied to the first input port or to the second input port.

3. The invention of claim 2, wherein a portion of energy from a first RF signal applied to the first input port of the primary strip inductor is available at the first connection port of the first spiral inductor, and a portion of energy from a second RF signal applied to the second input port of the primary strip inductor is available at the second connection port of the second spiral inductor.

4. The invention of claim 2, wherein a first RF signal applied to the first input port of the primary strip inductor is essentially absent at the second connection port of the second spiral inductor, and energy from a second RF signal applied to the second input port of the primary strip inductor is essentially absent at the first connection port of the first spiral inductor.

5. The invention of claim 2, wherein the first input port of the primary strip inductor is essentially isolated from the second connection port of the second spiral inductor, and the second input port of the primary strip inductor is essentially isolated from the first connection port of the first spiral inductor.

6. The invention of claim 5, wherein isolation of the first input port of the primary strip inductor from the second connection port of the second spiral inductor, and of the second input port of the primary strip inductor from the first connection port of the first spiral inductor, is at least about 30 dB.

7. The invention of claim 2, further including a ground plane situated between the first and second spiral inductors.

8. The invention of claim 2, wherein at least one tuning element is variable.

9. The invention of claim 2, wherein each of the first connection port and the second connection port is connected to a corresponding one of the at least one tuning element.

10. The invention of claim 2, wherein at least one tuning element includes at least one of a capacitor, resistor, and/or inductor.

11. The invention of claim 2, wherein at least one tuning element includes at least one of a C, RL, RC, LC, or RLC circuit.

12. The invention of claim 2, wherein at least one tuning element includes at least a switch.

13. The invention of claim 2, wherein energy available from at least one of the first connection port or the second connection port is applied to a feedback control circuit to adjust or regulate circuitry.

14. The invention of claim 2, wherein the length of the primary strip inductor between the first and second input ports is not dependent on a wavelength of an applied RF signal.

15. The invention of claim 2, wherein the primary strip inductor has a total length between the first and second input ports that is less than a quarter wavelength of an applied RF signal.

16. The invention of claim 2, wherein the primary strip inductor is essentially impedance neutral.

17. The invention of claim 2, wherein the first and second spiral inductors are spaced apart so as to be substantially isolated from each other.

18. The invention of claim 2, wherein at least one of the first and second spiral inductors is a multi-port spiral inductor.

19. The invention of claim 2, wherein the RF coupler has at least about 20 dB of directivity.

20. The invention of claim 2, wherein the first and second spiral inductors and the primary strip inductor are fabricated as part of an integrated circuit.

21. The invention of claim 2, wherein the primary strip inductor comprises at least two parts, each part electromagnetically coupled to an associated one of the first and second spiral inductors, wherein parts of the primary strip inductor associated with the first spiral inductor are connected to parts of the primary strip inductor associated with the second spiral inductor by at least one conductor that is not designed as a strip inductor.

* * * * *